(12) United States Patent
Schaefer

(10) Patent No.: US 6,188,220 B1
(45) Date of Patent: Feb. 13, 2001

(54) METHOD AND APPARATUS FOR MEASURING VIBRATION OF A MAGNETIC RESONANCE IMAGING SYSTEM

(75) Inventor: Daniel J. Schaefer, Waukesha, WI (US)

(73) Assignee: General Electric Company, Milwaukee, WI (US)

(*) Notice: Under 35 U.S.C. 154(b), the term of this patent shall be extended for 0 days.

(21) Appl. No.: 09/305,141

(22) Filed: May 4, 1999

(51) Int. Cl.[7] .................................................. G01V 3/00
(52) U.S. Cl. ........................ 324/318; 324/309; 324/322
(58) Field of Search .................................. 324/318, 322, 324/300, 307, 309, 312; 600/421, 422, 423, 424; 356/28.5; 73/597, 601

(56) References Cited

U.S. PATENT DOCUMENTS

| | | | |
|---|---|---|---|
| 4,712,560 | 12/1987 | Schaefer et al. ..................... | 128/653 |
| 5,427,102 | * 6/1995 | Shimode et al. ................... | 128/653.2 |
| 5,652,514 | * 7/1997 | Zhang et al. ........................ | 324/307 |
| 6,008,887 | * 12/1999 | Klein et al. ......................... | 356/28.5 |

* cited by examiner

Primary Examiner—Louis Arana
(74) Attorney, Agent, or Firm—Quarles & Brady; Christian G. Cabou; Phyllis Y. Price

(57) ABSTRACT

Vibration of the magnet assembly in a MRI system perturbs the magnetic field and adversely affects the images produced by the system. The perturbation of the magnetic field can be sensed by an apparatus having a source which emits a first signal that is reflected off the magnet assembly. A receiver detects a second signal formed by the reflected portion of the first signal. The first and second signals are processed to produce an output signal representing movement of the electromagnet and thus variation of the magnetic field. That output signal can be used by to components of the magnetic resonance imaging system to compensate for the effects that the vibration has on the images.

19 Claims, 2 Drawing Sheets

METHOD AND APPARATUS FOR MEASURING VIBRATION OF A MAGNETIC RESONANCE IMAGING SYSTEM

BACKGROUND OF THE INVENTION

The field of the invention is magnetic resonance imaging, and in particular the invention relates to sensing variation of the $B_0$ polarizing magnetic field resulting from vibration of the imaging apparatus.

Any nucleus, which possesses a magnetic moment, attempts to align itself with the direction of the magnetic field in which it is located. In doing so, however, the nucleus precesses around this direction at a characteristic angular frequency, known as the Larmor frequency, which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. However, if the substance or tissue is subjected to a magnetic field (excitation field B1) which is in the x-y plane and which is near the Larmor frequency, the net aligned moment, Mz, may be rotated, or "tipped", into the x-y plane to produce a net transverse magnetic moment $M_t$, which is rotating, or spinning, in the x-y plane at the Larmor frequency. The practical value of this phenomenon resides in the signal which is emitted by the excited spins after the excitation signal $B_1$ is terminated. There are a wide variety of measurement sequences in which this nuclear magnetic resonance ("NMR") phenomena is exploited.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques.

To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

MRI is particularly useful as a medical diagnostic tool. However, the ability to create detailed images which clearly depict anatomical features of the patient, depends upon an extremely stable polarizing magnetic field $B_0$. Mechanical vibration of the MRI system perturbs the polarizing magnetic field, thereby producing artifacts in the resultant magnetic resonance images. If the real-time displacement of the magnetic components could be accurately measured, then mathematical models could be used to estimate and correct the magnetic field variation due to that displacement. For whole body magnets, displacements on the order of a micron generate magnetic field changes of approximately one part per million. Thus a motion sensor for artifact correction must be capable of detecting submicron displacements.

The obvious approach to measuring the vibration would be to sense the variation of the polarizing magnetic field. However, the imaging system produces other magnetic fields, which vary at radio frequencies and thus can adversely affect the ability to sense changes in the polarizing magnetic field.

SUMMARY OF THE INVENTION

The present invention provides technique for detecting minute vibration of a magnet of a magnetic resonance imaging system which results in perturbation of the magnetic field. That technique generates a first signal having a predefined frequency X which is directed toward part of the magnetic resonance imaging system which is physically connected to the magnet. The first signal may be selected from among the microwave, ultrasound, sound and light spectra, for example. The signal also may originate from a resonant radio frequency coil whose properties change with displacement.

A portion of the first signal gets reflected by that part and then is received as a second signal. The first and second signals are processed to produce a output signal which represents movement of the electromagnet. That output signal can be employed in compensating for effects that the vibration has on the magnetic field and ultimately in images produced by the magnetic resonance imaging system.

In the preferred embodiment, the first and second signals are mixed together to produce an resultant signal that then is low-pass filtered. The base-band signal produced by the filtering than is applied to a quadrature detector which produces the output signal representing movement of the electromagnet.

DESCRIPTION OF THE PREFERRED EMBODIMENT

Figure 1:
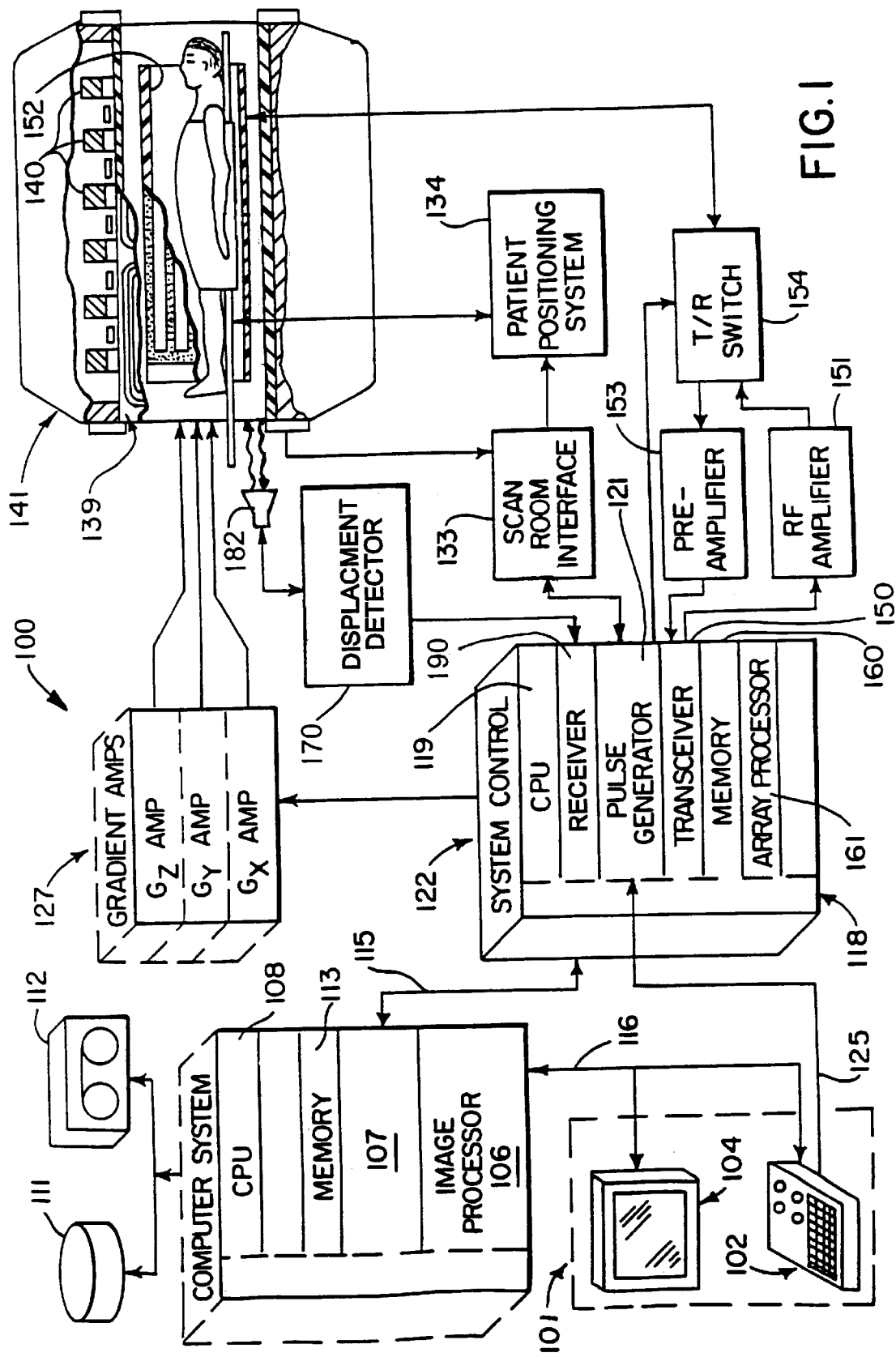
FIG. 1 is a block diagram of an MRI system which incorporates the present invention.

Referring first to FIG. 1, there is shown the major components of a preferred magnetic resonance imaging (MRI) system 100 which incorporates the present invention. The operation of the MRI system 100 is controlled from an operator console 101 which includes a keyboard and control panel 102 and a display 104. The console 101 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 101 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 for the $B_0$ field and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 101, this image data may be archived on the tape drive 112, or it may be further processed by the image processor 106 and conveyed to the operator console 101 and presented on the display 104.

For a more detailed description of the transceiver 150, reference is made to U.S. Pat. Nos. 4,952,877 and 4,922,736 which are incorporated herein by reference.

Referring still to FIG. 1, MRI system 100 also includes a displacement detector 170 which provides signals to the system control 122 which indicate vibration of the magnet assembly 141. The displacement detector uses interferometric motion sensing using a beam of radiation in the microwave, ultrasound, sound or light spectra. The present invention will be described in the context of an amplitude modulated microwave interferometer with the understanding that other wavelengths of radiation may be used and that one of ordinary skill in the art would appreciate from the description herein how to implement the present inventive concept utilizing other wavelengths.

Figure 2:
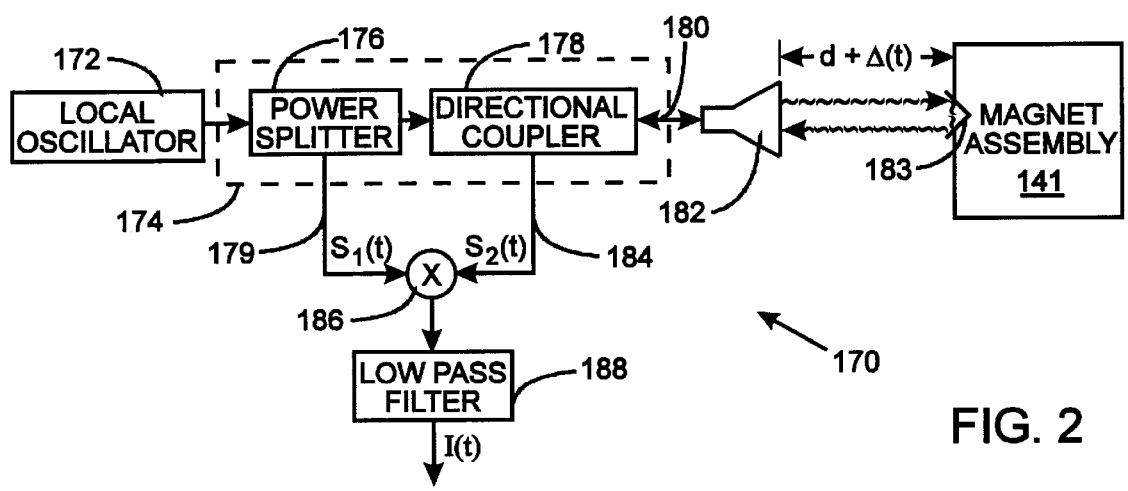
FIG. 2 is a block diagram depicting the present apparatus for measuring displacement of the magnet assembly in that MRI system.

With reference to FIG. 2, the displacement detector 170 includes a local oscillator 172 which produces a first signal $S_1(t)$ at the microwave frequency. The output signal of the local oscillator 172 is denoted by the expression:

$$S_1(t) = A \cos(\omega t) \quad (1)$$

where A is the signal amplitude and $\omega$ is the angular frequency of the signal. That output is applied to the input of a dual directional coupler 174 and specifically to a power splitter 176 which divides the input signal into two portions. One portion of the first signal is fed to a first output port 179 of the dual directional coupler 174. The remaining portion of the first signal from the local oscillator 172 passes through a directional coupler to a second port 180 of the dual directional coupler 174.

The second port 180 is connected to a microwave antenna 182 from which the signal radiates through the air to the magnet assembly 141. The antenna 182 is supported independently from the magnet assembly 141 so that vibration of the latter component does not affect the antenna. The instantaneous distance between the microwave antenna 182 and magnet assembly 141 is given by the expression d+Δ(t), where d represents the nominal distance and Δ(t) denotes the change in distance due to mechanical vibration of the magnet assembly. The nominal distance d is significantly greater than the maximum value of the vibration component Δ(t). The incident first signal from the antenna 182 travels at a velocity c and has a wavelength λ.

Some of the first signal which impinges upon a reflector 183 on the magnet assembly 141 is reflected back to the antenna 182. The time, τ, required for the signal to leave the antenna, strike the magnet assembly and return to the antenna is given by the equation:

$$\tau = 2(d + \Delta(t))/c \quad (2)$$

The reflection produces a second signal $S_2(t)$ which has a different amplitude B and phase as given by the expression:

$$S_2(t) + B \cos(\omega(t+\tau)) \quad (3)$$

The reflected second signal received by antenna 182 is fed back into the directional coupler 178 which channels this signal to a third output port 184 of the dual directional coupler 174. Output ports 179 and 184 are connected to inputs of a signal mixer 186 which multiplies the first and second signals $S_1(t)$ and $S_2(t)$ together. The product of the mixing is applied to a low-pass filter 138 and the produced baseband intermediate signal, I(t), at the output of the filter 188 may be expressed as:

$$I(t) = (AB/2)\cos(\omega t) \quad (4)$$
$$= (AB/2)\cos(2\omega(d + \Delta(t))/c)$$
$$= (AB/2)\cos(4\pi(d + \Delta(t))/\lambda)$$

This intermediate signal forms the output of the displacement detector 170.

The intermediate signal, I(t), from the displacement detector 170 is applied to a quadrature receiver 190 which is part of the system control 122 in FIG. 1. The quadrature receiver 190 may be used with either local oscillator signal or the received signal delayed by 90° before mixing in a second mixer. If $2\omega d/c+4\pi d/\lambda \ll 1$, then the baseband signal may be expressed as:

$$Q(t) = (AB/2)\sin(\omega t) \quad (5)$$
$$= (AB/2)\sin(2\omega(d+\Delta(t))/c)$$
$$\approx AB\omega(d+\Delta(t))/c$$
$$= 2\pi AB(d+\Delta(t))/\lambda$$

With a quadrature receiver 190, it is possible to obtain a baseband signal which depends only upon two $\omega d/t$ without any amplitude factors. The vibration signal, $S_b$, may be expressed as:

$$S_b = atan(I(t)/Q(t)) \quad (6)$$
$$= 2\omega(d+\Delta(t))/c$$
$$= 4\pi(d+\Delta(t))/\lambda$$

Thus, sub-wavelength variations and distance to the magnet assembly can be determined with high precision.

As noted previously, the vibration signal can be utilized in a mathematical models to estimate the magnetic field variation and that estimate than can be employed to correct for the effects due to the vibration.

Several modifications can be to the system described above. For example, a frequency-modulated (FM) configuration may be used as well as the amplitude modulated (AM) version described. Single-channel systems may be acceptable for some applications. It is possible to place a separate receiving antenna/transducer at the location of the magnet assembly, thereby boosting the received signal amplitude. Similarly, a reflecting device such as a corner reflector may be placed on the target to increase the received signal at the antenna.

Therefore, although some attention was given to various alternatives within the scope of the invention, it is anticipated that one skilled in the art will likely realize additional alternatives that are now apparent from disclosure of embodiments of the invention. Accordingly, the scope of the invention should be determined from the following claims and not limited by the above disclosure.

What is claimed is:

1. A method for acquiring data indicating variation of a magnetic field produced by an electromagnet of a magnetic resonance imaging system, said method comprising the steps of:

generating a first signal having a predefined wavelength $\lambda$;

directing the first signal to impinge upon part of the magnetic resonance imaging system which is physically connected to the electromagnet;

receiving a second signal formed by a portion of the first signal which is reflected by the part of the magnetic resonance imaging system;

processing the first and second signals to produce an output signal which represents movement of the electromagnet; and delivering the output signal to circuitry of the magnetic resonance imaging system for use in compensating for effects that variation of a magnetic field has on images produced by the magnetic resonance imaging system.

2. The method as recited in claim 1 wherein the predefined wavelength $\lambda$ of the first signal is selected from among the microwave, ultrasound, sound and light wavelengths.

3. The method as recited in claim 1 wherein the processing step multiplies the first and second signals.

4. The method as recited in claim 1 wherein the processing step mixes the first and second signals to produce a resultant signal.

5. The method as recited in claim 1 wherein the processing step further comprises low-pass filtering the resultant signal to produce an intermediate signal.

6. The method as recited in claim 1 wherein the processing step further comprises applying quadrature detection to the intermediate signal to produce the output signal.

7. The method as recited in claim 1 wherein the processing step comprises:

mixing the first and second signals to produce an intermediate signal l(t) given by the expression:

$$I(t)=(AB/2)\cos(4\pi(d+\Delta(t))/\lambda)$$

where A is the amplitude of the first signal, B is the amplitude of the second signal, $\lambda$ is the wavelength of the first signal, and $(d+\Delta(t))$ is the instantaneous distance between an emitter that directs the first signal and the part of the magnetic resonance imaging system;

applying quadrature detection to the intermediate signal to produce a quadrature signal Q(t) defined by the expression:

$$Q(t)=2\pi AB(d+\Delta(t))/\lambda; \text{ and}$$

combining the intermediate signal and the quadrature signal according to the expression:

$$S_b=atan(l(t)/Q(t))$$

to produce the output signal.

8. A method for acquiring data indicating variation of a magnetic field produced by an electromagnet of a magnetic resonance imaging system, said method comprising the steps of:

generating a first signal having a predefined wavelength $\lambda$;

transmitting the first signal toward part of the magnetic resonance imaging system which is physically connected to the electromagnet;

detecting interaction of the part of the magnetic resonance imaging system with the first signal which produces a second signal;

processing the second signal to produce an output signal which represents movement of the electromagnet; and delivering the output signal to circuitry of the magnetic resonance imaging system for use in compensating for effects that variation of a magnetic field has on images produced by the magnetic resonance imaging system.

9. The method as recited in claim 8 wherein the predefined wavelength $\lambda$ of the first signal is selected from among the microwave, ultrasound, sound and light wavelengths.

10. The method as recited in claim 8 wherein the step of detecting interaction comprises receiving the second signal which formed by a portion of the first signal that is reflected by the magnet assembly.

11. The method as recited in claim 8 wherein the processing step comprises:

mixing the first and second signals to produce a resultant signal;

low-pass filtering the resultant signal to produce an intermediate signal; and applying quadrature detection to the intermediate signal to produce the output signal.

12. In a magnetic resonance imaging system having a magnet assembly which produces a magnetic field, an apparatus for acquiring data related to variation of a magnetic field, said apparatus comprising:

a source of a first signal having a predefined wavelength $\lambda$;

an emitter which directs the first signal toward the magnet assembly;

a receiver which receives a second signal formed by a portion of the first signal which is reflected by the magnet assembly;

circuitry which processes the first and second signals to produce an output signal representing movement of the electromagnet; and conductors which deliver the output signal to components of the magnetic resonance imaging system for use in compensating for effects that variation of a magnetic field has on images produce d by the magnetic resonance imaging system.

13. The apparatus as recited in claim 12 wherein the predefined wavelength $\lambda$ of the first signal is selected from among the microwave, ultrasound, sound and light wave lengths.

14. The apparatus as recited in claim 12 further comprising a reflector coupled to the magnet assembly and reflecting the portion of the first signal toward the receiver.

15. The apparatus as recited in claim 12 further comprising a dual directional coupler connected to the source to receive the first signal and having a first port, a second port and a third port, wherein the dual directional coupler divides the first signal into a first portion which is fed to the first port and into a second portion that is fed to the second port which connected to the emitter, the second port also receiving the second signal which is applied to the third port.

16. The apparatus as recited in claim 12 further comprising a power splitter connected to the source and dividing the first signal into a first portion which is fed to an output port and into a second portion that is fed to the emitter.

17. The apparatus as recited in claim 12 wherein the circuitry comprises a mixer which combines the first and second signals to produce a resultant signal.

18. The apparatus as recited in claim 17 wherein the circuitry further comprises a low-pass filter which is connected to the mixer to produce an intermediate signal from the resultant signal.

19. The apparatus as recited in claim 18 wherein the circuitry further comprises a quadrature receiver connected to the low-pass filter and processing the intermediate signal to produce the output signal.

* * * * *